United States Patent [19]
Nakamura

[11] Patent Number: 5,314,871
[45] Date of Patent: May 24, 1994

[54] SUBSTRATE OF SINGLE CRYSTAL OF OXIDE, DEVICE USING SAID SUBSTRATE AND METHOD OF PRODUCING SAID SUPERCONDUCTIVE DEVICE

[75] Inventor: Kozo Nakamura, Hiratsuka, Japan

[73] Assignee: Kabushiki Kaisha Komatsu Seisakusho, Hiratsuka, Japan

[21] Appl. No.: 65,939

[22] Filed: May 21, 1993

Related U.S. Application Data

[62] Division of Ser. No. 689,947, Jul. 24, 1991, Pat. No. 5,240,902.

[30] Foreign Application Priority Data

Sep. 26, 1989 [JP] Japan .................................. 249930
Apr. 17, 1990 [JP] Japan .................................. 100837

[51] Int. Cl.$^5$ .................. B05D 5/12; B32B 18/00; C30B 25/02; H01L 39/00
[52] U.S. Cl. ...................... 505/238; 427/62; 427/126.3; 428/697; 428/930; 505/701; 505/729; 505/741; 505/451; 505/473; 505/476; 505/325; 505/452
[58] Field of Search ............ 505/701, 1, 729, 730, 505/741; 156/DIG. 63, DIG. 70, DIG. 78, 610; 428/930, 697, 602; 427/62, 126.3

[56] References Cited

U.S. PATENT DOCUMENTS

| | | | |
|---|---|---|---|
| 4,199,396 | 4/1980 | Brandle | 156/DIG. 63 |
| 4,379,853 | 4/1983 | Mateika | 156/DIG. 63 |
| 4,454,206 | 6/1984 | Mateika | 156/DIG. 63 |
| 4,820,445 | 4/1989 | Piekarczyk | 501/152 |

FOREIGN PATENT DOCUMENTS 50-134200 10/1975 Japan ................................. 505/1
64-48316 2/1989 Japan ................................. 505/1

OTHER PUBLICATIONS

International Application, International Publication No. WO 90/04857, Claim 1., May 1990.
"Superconducting Thin Films of $Tl_2Ca_2Ba_2Cu_3Oy$ and $Tl_2Ca_2Ba_2Cu_3OY'$," Ginley, Physical vol. 156, pp. 592–598. Nov. 1988.
Joint Committee on Powder Diffraction Standards No. 24-1191, Gordon, 1974. (No Month available).

*Primary Examiner*—Linda Skaling
*Assistant Examiner*—John Boyd
*Attorney, Agent, or Firm*—Welsh & Katz, Ltd.

[57] ABSTRACT

According to the present invention, when a superconductive thin film is formed on a substrate of a single crystal, a compound having a composition of $SrNdGaO_4$ and a $K_2NiF_4$ type crystal structure is used as a material employable for the substrate. Alternatively, a single crystal composed of an oxide in which Ca, La and Cr are added to the foregoing compound is used as a material employable for the substrate. Then, a superconductive thin film composed of an oxide is formed on the substrate by employing an epitaxial growing method. Thus, the present invention makes it possible to provide a superconductive material having an excellent property of lattice alignment, a stable and high critical superconductivity temperature and a stable critical superconductivity electric current.

10 Claims, 2 Drawing Sheets

SUBSTRATE OF SINGLE CRYSTAL OF OXIDE, DEVICE USING SAID SUBSTRATE AND METHOD OF PRODUCING SAID SUPERCONDUCTIVE DEVICE

This is a division of application Ser. No. 689,947, filed Jul. 24, 1991 now U.S. Pat. No. 5,240,902.

TECHNICAL FIELD

The present invention relates to a substrate of a single crystal composed of an oxide, a superconductive device having the substrate of a single crystal used therefor and a method of producing a superconductive device.

BACKGROUND ART

It has been heretofore said that a superconductive phenomenon appears with a most peculiar nature among various electromagnetical natures exhibited by a certain material. In view of the foregoing nature, it is expected that practical application of the superconductive phenomenon will largely be widened in near future by utilizing its natures such as complete electrical conductivity, complete antimagnetism, quantification of a magnetic flux or the like.

A high speed switching element, a detecting element having high sensitivity and a magnetic flux measuring instrument having high sensitivity can typically be noted as electronic devices for which the aforementioned superconductive phenomenon is utilized, and it is expected that these devices are practically used in the wide range of application.

For example, a thin film of $Nb_3Ge$ deposited on the surface of a substrate by employing a plasma spattering method can be noted as a typical superconductive material which has been hitherto used for a conventional superconductive device. However, since the thin film of $Nb_3Ge$ has a critical superconductivity temperature of about 23° K., the superconductive device can be used only at a temperature lower than that of a liquid helium. For this reason, when the liquid helium is practically used for the superconductive device, there arises a significant problem that a cooling cost and a technical burden to be born are increased because of a necessity for installing an equipment and associated instruments for cooling and liquidizing a helium gas with the result that practical use of the superconductive device not only in the industrial field but also in the household field is obstructed. Another problem is that an absolute quantity of helium source is small and limited.

To obviate the foregoing problems, a variety of endevors have been made to provide a superconductive material having a higher critical superconductivity temperature. Especially, in recent years, remarkable research works have been conducted for providing a superconductive thin film composed of an oxide having a higher superconductivity temperature. As a result derived from the research works, a critical superconductivity temperature is elevated to a level of 77° K. This makes it possible to practically operate a superconductive device having the foregoing superconductive thin film used therefor while using an inexpensive liquid nitrogen.

To form such a superconductive thin film composed of an oxide as mentioned above, a spattering method or a vacuum vaporizing/depositing method has been heretofore mainly employed such that the superconductive thin film is deposited on the surface of a substrate of a single crystal of MgO or $SrTiO_3$ which is preheated to an elevated temperature.

In addition, with respect to a single crystal employable for the substrate, attention has been paid to a sapphire, YSZ, a silicon, a gallium arsenide, $LiNbO_3$, GGG, $LaGaO_3$, $LaAlO_3$ or the like.

However, it has been found that the conventional method of forming a superconductive thin film while having a substrate of a single crystal of MgO or a substrate of a single crystal of $SrTiO_3$ used therefor as a substrate has problems that a critical superconductivity current (Jc) can not stably be elevated, and moreover a critical superconductivity temperature (Tc) is kept unstable.

To form an epitaxial film having excellent properties, it is necessary that a material employable as a substrate satisfactorily meets the following requirements.

(I) The lattice constants of substrate crystals are close to that of thin film crystals.

(II) A quality of the thin film is not degraded due to mutual diffusion to and from the substrate during an operation for growing an epitaxial thin film.

(III) The material employable as a substrate has a melting temperature higher than at lowest 1000° C., since it is heated up to an elevated temperature.

(IV) A single crystal having an excellent crystal quality is readily available on the commercial basis.

(V) The material employable as a substrate has an excellent property of electrical insulation.

On the other hand, with respect to a superconductive material composed of an oxide having a higher critical superconductivity temperature, many oxides each in the form of a thin film such as a $LnBa_2Cu_3O_{7-\delta}$ ($\delta=0$ to 1, Ln:Yb, Er, Y, Ho, Gd, Eu or Dy), a Bi-Sr-Ca-Cu-O base oxide, a Tl-Ba-Ca-Cu-O based oxide or the like have been heretofore reported.

All the oxides as mentioned above have lattice constants a and b each of which remains within the range of 3.76 to 3.92 angstroms. When a coordinate system for each oxide is turned by an angle of 45° so that it is visually observed in the turned state, $\sqrt{2}a$ and $\sqrt{2}b$ are recognized as a basic lattice, respectively. In this case, the lattice constants a and b are expressed such that they remain within the range of 5.32 to 5.54 angstroms.

In contrast with the aforementioned oxides, a magnesium oxide (MgO) which has been widely used as a material for a substrate at present has a lattice constant a of 4.203 angstroms and thereby a differential lattice constant between the aforementioned oxides and the magnesium oxide is enlarged to an extent of 7 to 11%. This makes it very difficult to obtain an epitaxially grown film having excellent properties. In addition, it has been found that things are same with a sapphire, YSZ, a silicon, a gallium arsenide, $LiNbO_3$ and GGG.

Further, in contrast with MgO, $SrTiO_3$ has a small differential lattice constant relative to the superconductive thin film composed of an oxide wherein the lattice constant remains within the range of 0.4 to 4%. Thus, $SrTiO_3$ is superior to MgO in respect of a lattice matching. However, $SrTiO_3$ is produced only with a Bernoulli method employed therefor. In addition, $SrTiO_3$ has a very poor crystal quality, and moreover it can be obtained only in the form of a large crystal having an etch pit density higher than $10^5$ pieces/cm$^2$. This makes it difficult to form an epitaxial film having excellent properties on the surface of a substrate having a poor crystal quality. It should be added that it is practically impossible to obtain a substrate having large dimensions.

A single crystal of LaGaO$_3$ has a lattice constant a of 5.496 angstroms and a lattice constant b of 5.5554 angstroms. Thus, it is expected that the single crystal of LaGaO$_3$ has an excellent lattice matching relative to the superconductive material composed of an oxide. However, since phase transition takes place at a temperature of about 150° C., there arises a problem that a twin crystal is contained in the single crystal. For this reason, removal of the twin crystal becomes a significant subject to be solved when a substrate for forming a superconductive thin film composed of a single crystal of LaGaO$_3$ is used practically.

In addition, since the single crystal of LaAlO$_3$ has lattice constants a and b of 3.788 angstroms, it is expected that it has an excellent lattice matching relative to the superconductive material composed of an oxide. With respect to the single crystal of LaAlO$_3$, however, it is very difficult to practically form a single crystal because of a very high melting temperature of 2100° C. Another problem is that a twin crystal is contained in the single crystal.

With respect to the conventional materials which have been heretofore used as a substrate for forming a superconductive thin film in the above-described manner, there arise problems that each of the conventional materials does not have an excellent lattice matching relative to the superconductive thin film, it does not satisfactorily meet the requirement for easily purchasing a single crystal on the commercial basis and thereby it is substantially impossible to produce a stable superconductive device.

The present invention has been made in consideration of the foregoing background. Therefore, an object of the present invention is to provide a material employable for a substrate of a single crystal which makes it possible to form an excellent epitaxial superconductive thin film. Another object of the present invention is to provide a superconductive thin film having a high quality which can be employed for a superconductive device without unstable superconductivity inherent to a superconductive thin film composed of an oxide.

DISCLOSURE OF THE INVENTION

According to a first aspect of the present invention, there is provided a substrate of a single crystal composed of a strontium-neodymium-gallium based oxide which is employable as a material for the substrate, wherein a composition of the substrate has a K$_2$NiF$_4$ type crystal structure represented by the following formula.

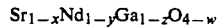

$Sr_{1-x}Nd_{1-y}Ga_{1-z}O_{4-w}$ ($-0.1 < x < 0.1$, $-0.1 < y < 0.1$, $-0.1 < z < 0.1$, $-0.2 < W < 0.2$).

Then, a superconductive thin film composed of the foregoing oxide is formed on the substrate by employing an epitaxial growing method.

In addition, according to a second aspect of the present invention there is provided a material employable for a substrate of a single crystal in which one or more selected from a group comprising a calcium having a mol ratio relative to a strontium within the range of 0.00001 to 0.1 mol, a lanthanum having a mol ratio relative to a neodymium within the range of 0.00001 to 0.1 mol and a chromium having a mol ratio relative to a gallium within the range of 0.00001 to 0.1 mol are added to a compound of which composition is SrNdGaO$_4$ wherein the compound has a K$_2$NiF$_4$ type crystal structure.

Then, a superconductive thin film composed of an oxide is formed on the foregoing substrate by employing an epitaxial growing method.

By the way, it was reported by Gordon et al that a sintered material of SrNdGaO$_4$ had a K$_2$NiF$_4$ type crystal structure and its lattice constant a was 3.82 angstroms (Joint Committee on Powder Diffraction Standards. (1972) NO 24-119).

As mentioned above, the hitherto reported superconductive materials each composed of an oxide having a high superconductivity temperature have lattice constants a and b each of which remains within the range of 3.76 to 3.92 angstroms.

Therefore, the lattice constant of SrNdGaO$_4$ has a substantially middle value within the range of 3.76 to 3.92. When a coordinate system of the superconductive oxide material of SrNdGaO$_4$ is turned by an angle of 45° so that it is visually observed in the turned state, $\sqrt{2}a$ can be recognized as a basic lattice wherein a lattice constant is 5.40 angstroms. However, in a case where $\sqrt{2}a$ of the superconductive thin film composed of an oxide is recognized as a basic lattice, the lattice constant of the superconductive thin film remains within the range of 5.3 to 5.54 angstroms. Thus, a differential lattice constant relative to the superconductive thin film composed of an oxide of a single crystal of SrNdGaO$_4$ is very small, as represented by the range of $-1.6$ to 2.6%. In addition, since each of the hitherto reported superconductive materials is very similar in crystal structure to SrNdGaO$_4$ and it has a very excellent lattice matching relative to the superconductive thin film composed of an oxide of a single crystal of SrNdGaO$_4$, it has all the conditions as mentioned.

However, there has not been hitherto seen any report on a single crystal of SrNdGaO$_4$. For this reason, nobody knows anything as to whether the single crystal of SrNdGaO$_4$ can practically be produced or not.

In view of the foregoing background, the inventors conducted a variety of research works for the purpose of producing a single crystal of SrNdGaO$_4$. As a result derived from the research works, the inventors succeeded in producing a single crystal of SrNdGaO$_4$ on the trial basis by employing a crucible cooling method.

Specifically, when the single crystal of SrNdGaO$_4$ was produced, a mixture of pulverized materials which were mixed together such that a mol ratio among SrCO$_3$, Nd$_2$O$_3$ and Ca$_2$O$_3$ was set to 2:1:1 was used as a raw material. The mixture was calcined at 1200° C. and the calcined mixture was crushed and ground to perform a press-molding operation with the pulverized mixture. Thereafter, a green compact derived from the press-molding operation was sintered at 1300° C. to obtain a sintered compact. The sintered compact was placed in a crucible made of a platinum in which it was heated up to an elevated temperature higher than a melting temperature of the raw material. Thereafter, the sintered compact was gradually cooled at a rate of 1° C./min.

As a result, a large plate-shaped single crystal having a substantially square shape and a size within the range of 5 to 15 mm with its plate surface as a C plane could be obtained. Additionally, it was found that the raw material had a melting temperature of about 1480° C.

This means that the resultant single crystal was a single crystal having a sufficiently high melting temperature.

It was confirmed that the thus obtained single crystal had a composition which remained within the range represented by the following formula.

$$Sr_{1-x}Nd_{1-y}Ga_{1-z}O_{4-w}$$

($-0.1 < x < 0.1$, $-0.1 < y < 0.1$, $-0.1 < z < 0.1$, $-0.2 < W < 0.2$).

Then, a superconductive thin film composed of an oxide was deposited and grown in an epitaxial manner on the substrate of the single crystal of $Sr_{1-x}Nd_{1-y}Ga_{1-z}O_{4-w}$ produced in the above-described manner by employing a spattering method, a vacuum vaporizing/depositing method or the like. As a result, a superconductive thin film having excellent superconductivity could be obtained.

In addition, it was found that the single crystal of $Sr_{1-x}Nd_{1-y}Ga_{1-z}O_{4-z}$ could be produced also by employing a Czochralski method.

For example, a (001) axis single crystal having a diameter of 25 mm and a length of 100 mm could be obtained by using a sintered material having a composition of $Sr_{1-2x}Nd_{1+x}Ga_{1+x}O_{4+x}$ ($0 < x < 0.1$) as a raw material. Specifically, the sintered material was heated and molten at a high temperature to produce a molten substrate. Then, the molten substrate was pulled up under an atmosphere containing an oxygen by 1% by volume under the operational conditions that a pulling-up speed was set to 1 to 6 mm/hr and a rotational speed of crystal was set to 10 to 60 rpm.

In addition to the Czochralski method, a zone melting method, a Bridgeman method or the like could be also employed to produce the same single crystal as mentioned above.

Further, a superconductive thin film composed of an oxide having very excellent properties could be produced by using a substrate of a single crystal of $SrNdGaO_4$ with impurities added thereto according to the second aspect of the present invention.

It is believed that this is attributable to the fact that the surface of the substrate was chemically activated by addition of the impurities and thereby an epitaxially grown film having excellent properties could be formed on the substrate.

Additionally, the inventors produced various kinds of single crystals each composed of mixed crystals. As a result, the inventors found out impurities which enabled only the surface state of the single crystal to be kept good without any deterioration of a crystal quality as well as without any increase of difficulty associated with the technology for growing the single crystal. Additionally, the inventors found out a limit of addition of each of the impurities.

It was found that all the impurities, i.e, Ca, La and Cr had an effect for varying lattice constants of the single crystal but the single crystal was not largely affected as long as a quantity of addition of each of the impurities remained within the aforementioned range.

BEST MODE FOR CARRYING OUT THE INVENTION

Figure 1:
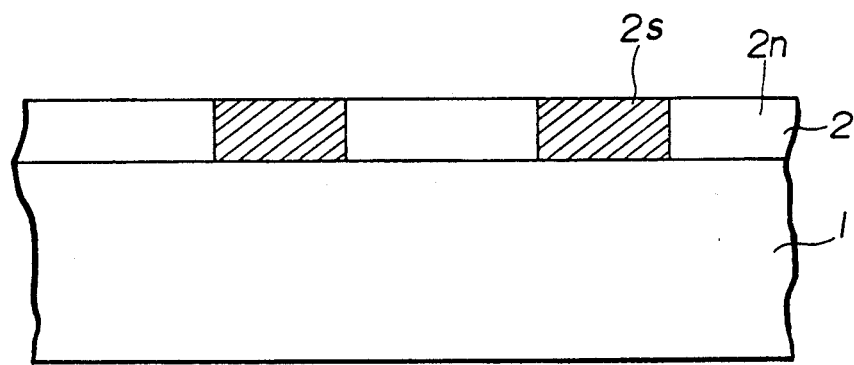
FIG. 1 is a schematic view illustrating a superconductive thin film in accordance with a first embodiment of the present invention.

Now, the present invention will be described in detail hereinafter with reference to the accompanying drawings which illustrate several preferred embodiments of the present invention.

EMBODIMENT 1

First, description will be made below with respect to a method of producing a single crystal of $SrNdGaO_4$.

717.3 g of $Nd_2O_3$ (having a purity of 99.99%), 541.2 g of $SrCO_3$ (having a purity of 99.999%) and 400.8 g of $Ga_2O_3$ (having a purity of 99.999%) were mixed together and the resultant mixture was calcined at 1200° C. so that it was subjected to decarbonizing. Thereafter, the mixture was crushed and ground to perform a press-molding operation with the pulverized mixture.

A green compact derived from the press-molding operation was sintered at 1300° C. under an environmental atmosphere, whereby a sintered product of $Sr_{0.9}Nd_{1.05}Ga_{1.05}O_{4.05}$ having a weight of about 1500 g was obtained.

The sintered product was placed in a crucible of an iridium having an outer diameter of about 80 mm, a height of about 80 mm and a wall thickness of about 2 mm so that it was molten by high frequency heating. It should be noted that a nitrogen atmosphere containing an oxygen of 0.5 to 2% was employed for performing the high frequency heating. The reason why the oxygen was added to the atmosphere consists in suppressing vaporization of a gallium oxide.

After the sintered product of $Sr_{0.9}Nd_{1.05}Ga_{1.05}O_{4.05}$ was molten in the above described manner, a single crystal of $SrNdGaO_4$ was grown by employing a Czochralski method for pulling up a molten substrate.

At first, a [100] axis single crystal of $SrTiO_3$ was used as a seed crystal. After a single crystal of $SrNdGaO_4$ was obtained, a single crystal having a (001) orientation in the foregoing single crystal was uses as a seed crystal. As a result, a [001] axis single crystal having a diameter of 25 mm and a length of 100 mm could be obtained by performing a pulling-up operation under the operational conditions that a pulling-up speed was set to 1 mm/hr and a rotational speed of the single crystal was set to 30 rpm.

The single crystal of $SrNdGaO_4$ which had been produced in the above-described manner was sliced to successively produce wafers. Each of the wafers was used as a substrate of a (001) plane single crystal having the wafer-shaped configuration. Then, a thin film of $YBa_2Cu_3O_{7-\delta}$ having a thickness of 1000 angstroms was deposited on the wafer-shaped substrate of a single crystal under an atmosphere of a mixture of argon and oxygen (having a mixing ratio of 1:1) by employing a RF magnetron spattering method. It should be noted that the single crystal of $SrNdGaO_4$ was used as a target material wherein a composition ratio of the single crystal was determined such that the composition ratio of the single crystal after formation of the thin film coincided with that of $YBa_2Cu_3O_{7-\delta}$. The operational conditions for the formation of the thin film were determined such that a gas pressure was set to 10 Pa, an electric power was set to 300 W and a temperature of the substrate was set to 600° C.

After the thin film was deposited on the single crystal, the substrate was annealed for one hour at 900° C. under an atmosphere of oxygen.

Thereafter, as shown in FIG. 1, a thin film 2 of YBa$_2$Cu$_3$O$_{7-\delta}$, exclusive of the region which was transformed into a circuit portion 2s by employing an electronic beam radiating method or the like, was used as a normally electrically conductive portion 2n while forming a pattern for the thin film of YBa$_2$Cu$_3$O$_{7-\delta}$ to serve as a circuit portion 2s. Thus, a device such as a memory device constructed by using superconductive materials could be formed under the condition that the pattern 2s of the superconductive thin film which had been formed on the substrate 1 of the single crystal of SrNdGaO$_4$ in the above described manner was used as a basic structural component.

A zero resistance temperature T$_{c0}$ of the thin film of YBa$_2$Cu$_3$O$_{7-\delta}$ formed in the above-described manner and a critical superconductivity electric current J$_c$ of the same at 77° K. were measured by employing a four terminal method.

The results derived from the measurements are shown in Table 1.

For the purpose of comparison, a thin film of YBa$_2$Cu$_3$O$_{7-\delta}$ was deposited on the (100) plane single crystal of SrTiO$_3$ which had been heretofore used as a substrate under the same operational conditions as mentioned above. In addition, the results derived from measurements conducted for the zero resistance temperature T$_{c0}$ and the critical superconductivity electric current J$_c$ at 77° K. at the time when the foregoing thin film was deposited in the above-described manner are shown in Table 1.

TABLE 1

| material of substrate | T$_c$ | J$_c$ (A/cm$^2$) |
|---|---|---|
| (SrTiO$_3$) | 79 | $0.5 \times 10^4$ |
| SrNdGaO$_4$ | 85 | $1 \times 10^5$ |

As is apparent from the results shown in Table 1, the case where the single crystal of SrNdGaO$_4$ was used as a substrate is superior in respect of T$_{c0}$ and J$_c$ to the case where the single crystal of SrTiO$_3$ was used as a substrate. It is considered that the reason why the former case is superior to the latter case consists in that the substrate of the single crystal of SrNdGaO$_4$ had an excellent property of crystallization of the thin film and an excellent property of uniformity of the same compared with the substrate of the single crystal of SrTiO$_3$.

Then, the property of crystallization on the surface of the superconductive thin film which had been formed in the above-described manner was visually observed by utilizing reflective diffraction of an electron beam at a high speed. The results derived from the visual observation revealed that a sharp streak-shaped diffraction pattern representing a (001) orientation could be obtained with the superconductive thin film formed on the substrate of the single crystal of SrNdGaO$_4$, and moreover an epitaxially grown film having excellent properties was formed on the foregoing substrate.

In addition, a superconductive thin film was formed on the substrate of the single crystal of SrNdGaO$_4$ similar to the aforementioned one under the same operational conditions as mentioned above while LnBa$_2$Cu$_3$O$_{7-\delta}$ ($\delta$=0 or 1, Ln=Yb, Er, Y, Ho, Gd, Eu or Dy) was used as a target material. It was found from the results derived from visual observation of the superconductive thin film that a sharp streak-shaped diffraction pattern representing a (001) orientation could be obtained with the substrate of the single crystal of SrNdGaO$_4$, and moreover an epitaxially grown film having excellent properties was formed on the substrate of the single crystal of SrNdGaO$_4$.

EMBODIMENT 2

Next, the present invention will be described below with respect to a second embodiment thereof. According to the second embodiment of the present invention, a thin film of Bi$_2$Sr$_2$Ca$_2$Cu$_3$O$_x$ having a thickness of 1000 angstroms was deposited on a substrate of a single crystal of SrNdGaO$_4$ formed with the use of the same method as that in the first embodiment of the present invention under an atmosphere of a mixture of argon and oxygen (having a mixing ratio of 2:1) by employing a RF magnetron spattering method. It should be noted that a material having such a composition that a composition ratio after formation of the thin film coincided with that of Bi$_2$Sr$_2$Ca$_2$Cu$_3$O$_x$ was employed as a target material. In addition, the thin film was formed under the operational conditions that a gas pressure was set to 5 Pa, an electric power was set to 200 W and a temperature of the substrate was set to 600° C.

After the thin film was deposited in the above-described manner, it was annealed for one hour at 900° C. under an atmosphere of oxygen.

A device such as a memory device constructed by using superconductive materials could be formed while the pattern 12 of the superconductive thin film formed on the substrate of the single crystal of SrNdGaO$_4$ in the above-described manner was employed as a basic structural component.

Figure 2:
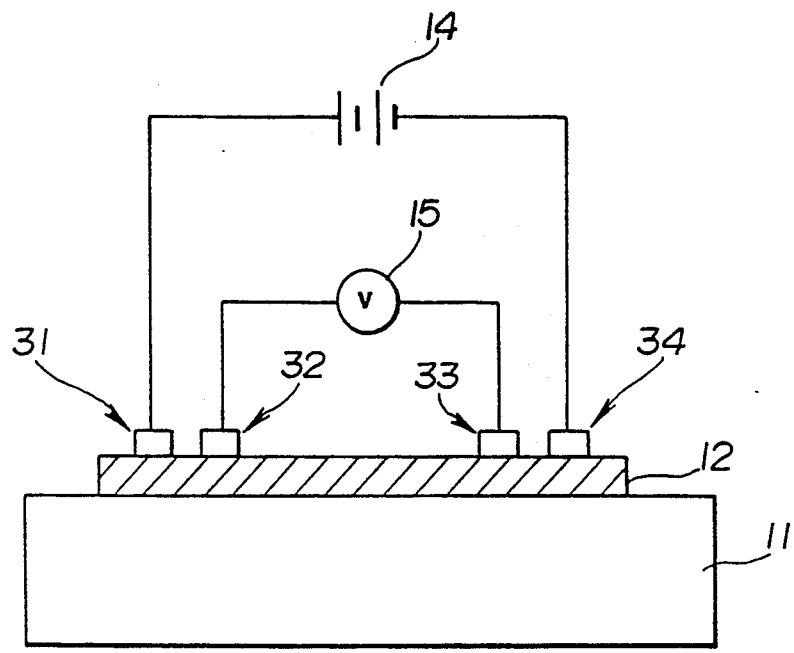
FIG. 2 is a schematic view of a measuring apparatus in accordance with a second embodiment of the present invention.

Thereafter, as shown in FIG. 2, electrodes 31, 32, 33 and 34 each made of a gold were formed on the superconductive thin film 12 with the aid of a mask for forming electrodes, and a zero resistance temperature T$_{c0}$ of the thin film of Bi$_2$Sr$_2$Ca$_2$Cu$_3$O$_x$ and a critical superconductivity electric current J$_c$ of the same at 77° K. were measured by employing a four terminal method. In FIG. 2, reference numeral 14 designates a stabilizing power supply and reference numeral 15 designates a potentiometer.

Subsequently, a zero resistance temperature T$_{c0}$ of the thin film of Bi$_2$Sr$_2$Ca$_2$Cu$_3$O$_x$ formed on the substrate 11 of the single crystal of SrNdGaO$_4$ and a critical superconductivity electric current J$_c$ of the same at 77° K. were measured by employing a four terminal method.

The results derived from the measurements are shown in Table 2.

TABLE 2

| material of substrate | Tc | Jc (A/cm$^2$) |
|---|---|---|
| (SrTiO$_3$) | 90 | $1.5 \times 10^4$ |
| SrNdGaO$_4$ | 108 | $2 \times 10^6$ |

As is apparent from the results shown in the table, the case where the single crystal of SrNdGaO$_4$ was used as a substrate is superior in respect of T$_{c0}$ and J$_c$ to the case where the single crystal of SrTiO$_3$ was used as a substrate. It is considered that the reason why the former case is superior to the latter case consists in that the substrate of the single crystal of SrNdBaO$_4$ had an excellent crystal quality of the thin film and an excellent property of uniformity of the same compared with the substrate of the single crystal of SrTiO$_3$ and thereby an excellent thin film similar to that in a case of the first embodiment of the present invention could be obtained when the thin film of Bi$_2$Sr$_2$Ca$_2$Cu$_3$O$_x$ was formed on the foregoing substrate.

EMBODIMENT 3

Next, the present invention will be described below with respect to a third embodiment thereof. According to the third embodiment of the present invention, a thin film of $Tl_2Ba_2Ca_2Cu_3O_x$ having a thickness of 1000 angstroms was deposited on a substrate of a (001) plane single crystal of $SrNdGaO_4$ which had been formed with the use of the same method as that in the first embodiment of the present invention under an atmosphere of a mixture of argon/oxygen (having a mixing ratio of 1:1) by employing a RF magnetron spattering method. It should be noted that a material having such a composition that a composition ratio after formation of the thin film coincided with that of $Tl_2Ba_2Ca_2Cu_3O_x$ was employed as a target material, and moreover the operational conditions for forming the thin film at that time were determined such that a gas pressure was set to 10 Pa, an electric power was set to 80 W and a temperature of the substrate was set to 600° C.

After the thin film was deposited on the substrate in the above-described manner, an assembly of the substrate and the thin film was wrapped in a gold foil and the wrapped assembly was annealed for 10 minutes at 905° C. under an atmosphere of oxygen. It should be added that the reason why the assemble was wrapped in a gold foil consists in that vaporization of a thallium should be prevented.

A zero resistance temperature $T_{c0}$ of the thin film of $Tl_2Ba_2Ca_2Cu_3O_x$ produced in the above-described manner and a critical superconductivity electric current $J_c$ at 77° K. were measured by employing a four terminal method.

The results derived from the measurements are shown in Table 3.

TABLE 3

| material of substrate | $T_c$ | $J_c (A/cm^2)$ |
|---|---|---|
| $SrTiO_3$ | 92 | $0.5 \times 10^4$ |
| $SrNdGaO_4$ | 108 | $5 \times 10^5$ |

Also in this embodiment, as is apparent from the results shown in Table 3, the case where the single crystal of $SrNdGaO_4$ was used as a substrate is superior in respect of $T_{c0}$ and $J_c$ to the case where the single crystal of $SrTiO_3$ was used as a substrate. It is considered that the reason why the former case is superior to the latter case consists in that an excellent thin film of $Tl_2Ba_2Ca_2Cu_3O_x$ could be obtained in the same manner as in the first embodiment and the second embodiment of the present invention, because the substrate derived from the single crystal of $SrNdGaO_4$ had an excellent crystal quality of the thin film and an excellent property of uniformity of the same compared with the substrate derived from the single crystal of $SrTiO_3$.

EMBODIMENT 4

Next, the present invention will be described below with respect to a method of producing a single crystal of $Sr_{1-x}Ca_xNd_{1-y}Nd_yGa_{1-z}Cr_zO_4$.

562.58 g of $SrCO_3$ (having a purity of 99.99%), 20.07 g of $CaCO_3$ (having a purity of 99.99%), 640.96 g of $Nd_2O_3$ (having a purity of 99.99%), 32.67 g of $La_2O_3$ (having a purity of 99.99%), 345.86 g of $Ga_2O_3$ (having a purity of 99.999%) and 24.39 g of $Cr_2O_3$ (having a purity of 99.999%) were mixed together and the resultant mixture was calcined at 1000° C. After the calcined mixture was subjected to decarbonizing, the mixture was crushed and ground and a press-molding operation was performed using the pulverized material.

A green compact derived from the press-molding operation was sintered at 1300° C. under an environmental atmosphere, whereby a sintered compact of $Sr_{0.95}Ca_{0.05}Nd_{0.95}La_{0.05}Ga_{0.92}Cr_{0.08}O_4$ having a weight of about 1450 g was obtained.

The sintered compact was placed in a crucible of an iridium or platinum having an outer diameter of about 80 mm, a height of about 80 mm and a wall thickness of 2 mm so that it was molten by high frequency induction heating. It should be noted that a nitrogen atmosphere containing an oxygen by 0.5 to 2% was employed when the sintered compact was molten in the crucible made of an iridium. In contrast with this, when the sintered compact was molten in the crucible made of a platinum, a nitrogen atmosphere containing an oxygen by 10 to 21% was used. The reason why an oxygen was added to the atmosphere consists in decomposition and vaporization of a gallium oxide should be prevented.

After the sintered compact of $Sr_{0.95}Ca_{0.05}Nd_{0.95}La_{0.05}Ga_{0.92}Cr_{0.08}O_4$ was molten in the above-described manner, a single crystal having the foregoing composition was grown by employing a Czochralski method for pulling up a molten substrate.

A [100] axis single crystal of $SrNdGaO_4$ was used as a seed crystal. As a result, a [100] axis single crystal of $SrNdGaO_4$ having a diameter of 30 mm and a length of 70 mm could be obtained under the operational conditions that a pulling-up speed was set to 1 mm/hr and a rotational speed of the single crystal was set to 25 rpm.

The thus obtained single crystal of $SrNdGaO_4$ containing Ca, La and Cr as impurities was sliced so as to successively produce wafer-shaped substrates each composed of a (001) plane single crystal. Then, a thin film of $YBa_2Cu_3O_{7-\delta}$ having a thickness of 1000 angstroms was deposited on the wafer-shaped substrate of a $SrNdGaO_4$ based (001) plane single crystal under an atmosphere of a mixture of argon and oxygen (having a mixing ratio of 1:1) by employing a RF magnetron spattering method. A composition ratio of a target material was adjusted such that the composition ratio of the thin film after formation of the same coincided with that of $YBa_2Cu_3O_{7-\delta}$. The operational conditions for growing the single crystal were determined such that a gas pressure was set to 10 Pa, an electric power was set to 300 W and a temperature of the substrate was set to 600° C.

After the thin film was deposited on the substrate, an assembly of the substrate and the thin film was annealed for one hour at 900° C. under an oxygen atmosphere.

Thereafter, electrodes each composed of a gold were formed on the assembly with the aid of a mask for forming the electrodes by employing a vacuum vaporizing-/depositing method.

A zero resistance temperature $T_{c0}$ of the thus formed thin film of $YBa_2Cu_3O_{7-\delta}$ and a critical superconductivity electric current $J_c$ of the same at 77° K. were measured by employing a four terminal method.

The results derived from the measurements are shown in Table 4.

TABLE 4

| mol ratio | | | | | | | $J_c (A/cm^2)$ |
|---|---|---|---|---|---|---|---|
| Sr | Ca | Nd | La | Ga | Cr | $T_{c0}$ | |
| 1 | 0 | 1 | 0 | 1 | 0 | 85 | $1 \times 10^5$ |
| 0.95 | 0.05 | 0.95 | 0.05 | 0.92 | 0.08 | 87 | $5 \times$ |

TABLE 4-continued

| mol ratio | | | | | | | $J_c$ (A/ |
|---|---|---|---|---|---|---|---|
| Sr | Ca | Nd | La | Ga | Cr | $T_{c0}$ | cm$^2$) |
| 0.9994 | 0.0006 | 1 | 0 | 1 | 0 | 88 | $3 \times 10^5$ |
| 1 | 0 | 0.9994 | 0.0006 | 1 | 0 | 87 | $3 \times 10^5$ |
| 1 | 0 | 1 | 0 | 0.9994 | 0.0006 | 87 | $2.5 \times 10^5$ |

For the purpose of comparison, a thin film of YBa$_2$Cu$_3$O$_{7-\delta}$ was deposited on the substrate of the single crystal of SrNdGaO$_4$ containing Ca, La and Cr as impurities by a different content under the same operational conditions as those mentioned above. The results derived from the measurements conducted for determining the zero resistance temperature $T_{c0}$ and the critical superconductivity electric current $J_c$ at 77° K. are as shown in Table 1.

As is apparent from the results shown in Table 4, properties of the single crystal represented by the zero resistance temperature $T_{c0}$ and the critical superconductivity electric current $J_c$ at 77° K. were substantially improved by adding Ca, La, and Cr to the substrate as impurities.

When a content of each of these elements represented by a mol ratio was lower than 0.00001, no significant effect was recognized. On the contrary, when the content of the same is higher than 0.1, cracks or cells readily appeared on the single crystal.

It should be noted that only one of the aforementioned impurities may be contained in the substrate or two or three kinds of impurities may be contained in the substrate in the combined state.

EMBODIMENT 5

Next, the present invention will be described below with respect to a fifth embodiment of the present invention. According to the fifth embodiment of the present invention, a single crystal of SrNdGaO$_4$ containing Ca, La and Cr as impurities which was produced with the use of the same method as that in the fourth embodiment of the present invention was sliced so as to successively form wafer-shaped substrates each constituted by a (001) plane single crystal. Then, a thin film of Bi$_2$Sr$_2$Ca$_2$Cu$_3$O$_x$ having a thickness of 1000 angstroms was deposited on the wafer-shaped substrate derived from the single crystal of SrNdGaO$_4$ under an atmosphere of a mixture of argon and oxygen (having a mixing ratio of 2:1) by employing a RF magnetron spattering method. In this embodiment, the composition ratio of a target material was adjusted such that the composition ratio after formation of the thin film coincided with that of Bi$_2$Sr$_2$Ca$_2$Cu$_3$O$_x$. It should be added that formation of the thin film was accomplished under the operational conditions that a gas pressure was set to 5 Pa, an electric power was set to 200 W and a temperature of the substrate was set to 600° C.

After the thin film was deposited on the substrate, an assembly of the substrate and the thin film was annealed for one hour at 900° C. under an oxygen atmosphere.

Electrodes each composed of gold were formed on the thus produced thin film of Bi$_2$Sr$_2$Ca$_2$Cu$_3$O$_x$ in the same manner as in the fourth embodiment of the present invention, and a zero resistance electric current $T_{c0}$ and a critical superconductivity electric current $j_c$ at 77° K. were measured by employing a four terminal method.

The results derived from the measurement are shown in Table 5.

TABLE 5

| mol ratio | | | | | | | $J_c$ (A/ |
|---|---|---|---|---|---|---|---|
| Sr | Ca | Nd | La | Ga | Cr | $T_{c0}$ | cm$^2$) |
| 1 | 0 | 1 | 0 | 1 | 0 | 108 | $2 \times 10^6$ |
| 0.95 | 0.05 | 0.95 | 0.05 | 0.92 | 0.08 | 110 | $5 \times 10^6$ |
| 0.9994 | 0.0006 | 1 | 0 | 1 | 0 | 111 | $4 \times 10^6$ |
| 1 | 0 | 0.9994 | 0.0006 | 1 | 0 | 110 | $4 \times 10^6$ |
| 1 | 0 | 1 | 0 | 0.9994 | 0.0006 | 110 | $4 \times 10^6$ |

As is apparent from the results shown in Table 5, properties of the single crystal represented by the zero resistance temperature $T_{c0}$ and the critical superconductivity electric current $J_c$ at 77° K. were substantially improved by adding Ca, La and Cr to the substrate as impurities.

It is considered that when the thin film of Bi$_2$Sr$_2$Ca$_2$Cu$_3$O$_x$ was formed in the above-described manner, a thin film having the same excellent properties as those in the first embodiment of the present invention could be obtained.

EMBODIMENT 6

Next, the present invention will be described below with respect to a sixth embodiment of the present invention. According to the sixth embodiment of the present invention, a single crystal of SrNdGaO$_4$ containing Ca, La and Cr as impurities which was produced by employing the same method as that in the fourth embodiment of the present invention was sliced to successively form wafer-shaped substrates each constituted by a (001) plane single crystal. Then, a thin film of Tl$_2$Ba$_2$Ca$_2$Cu$_3$O$_x$ having a thickness of 1000 angstroms was deposited on the wafer-shaped substrate derived from the single crystal of SrNdGaO$_4$ under an atmosphere of a mixture of argon and oxygen (having a mixing ratio of 1:1) by employing a RF magnetron spattering method. In this embodiment, the composition ratio of a target material was adjusted such that the composition ratio after formation of the thin film coincided with that of Tl$_2$Ba$_2$Ca$_2$Cu$_3$O$_x$. It should by added that formation of the thin film was accomplished under the operational conditions that a gas pressure was set to 10 Pa, an electric power was set to 80 W and a temperature of the substrate was set to 600° C.

After the thin film was deposited on the substrate, an assembly of the substrate and the thin film was wrapped in a gold foil and the wrapped assembly was annealed for 10 minutes at 905° C. under an oxygen atmosphere. It should be noted that the reason why the assembly was wrapped in a gold foil consists in that vaporization of a thallium should be prevented.

Electrodes each composed of gold were formed on the thus produced thin film of Tl$_2$Ba$_2$Ca$_2$Cu$_3$O$_x$ in the same manner as in the fourth embodiment and the fifth embodiment of the present invention, and a zero resistance temperature $T_{c0}$ and a critical superconductivity electric current $J_c$ at 77° K. were measured by employing a four terminal method.

The results derived from the measurements are shown in Table 6.

TABLE 6

| | | mol ratio | | | | $T_{c0}$ | $J_c$ (A/cm$^2$) |
|---|---|---|---|---|---|---|---|
| Sr | Ca | Nd | La | Ga | Cr | | |
| 1 | 0 | 1 | 0 | 1 | 0 | 108 | $5 \times 10^5$ |
| 0.95 | 0.05 | 0.95 | 0.05 | 0.92 | 0.08 | 112 | $2.1 \times 10^6$ |
| 0.9994 | 0.0006 | 1 | 0 | 1 | 0 | 111 | $1.8 \times 10^6$ |
| 1 | 0 | 0.9994 | 0.0006 | 1 | 0 | 112 | $1.9 \times 10^6$ |
| 1 | 0 | 1 | 0 | 0.9994 | 0.0006 | 111 | $1.8 \times 10^6$ |

Also in this embodiment, as is apparent from the results shown in Table 6, properties of the assembly represented by the zero resistance temperature $T_{c0}$ and the critical superconductivity electric current $J_c$ at 77° K. were substantially improved by adding Ca, La and Cr to the substrate as impurities.

It is considered that also in the case where the thin film of $Tl_2Ba_2Ca_2Cu_3O_x$ was formed in the above-described manner, a thin film having the same excellent properties as those in the fourth embodiment and the fifth embodiment of the present invention could be obtained.

It should of course be understood that the present invention should not be limited only to the aforementioned several embodiments thereof but the present invention may equally be applied to a case where a superconductive thin film composed of other oxide is formed.

According to each of the aforementioned embodiments of the present invention, a RF magnetron spattering method was employed to form a superconductive thin film composed of an oxide. However, the present invention should not be limited only to this method. Alternatively, a vacuum vaporizing/depositing method, a hypercomplex vaporizing/depositing method, a molecular beam epitaxy method, a MSD method or the like may be employed for carrying out the present invention.

Further, each of the aforementioned embodiments of the present invention has been described above with respect to a case where a (001) plane was employed as a reference orientation plane. However, the same advantageous effects as those mentioned above can be obtained also in a case where a (100) plane and a (110) plane are employed.

In addition, according to each of the aforementioned embodiments of the present invention, Ca, La and Cr were added to a substrate as impurities. Alternatively, Ba, Mg, Na, K, Al, Fe, Si, Ce, Pr and Zr may be added to the substrate with some advantageous effect but without any clearly recognizable advantageous effects as obtained in the case where Ca, La and Cr were added as impurities.

INDUSTRIAL APPLICABILITY

As will readily be apparent from the above description, the present invention has made it possible to practically use various kinds of superconductive devices.

I claim:

1. A superconductive device, wherein said device comprises;
   a substrate of a single crystal, said single crystal comprising at least one element selected from the group consisting of calcium having a mol ratio relative to strontium within the range of 0.00001 to 0.1 mol, lanthanum having a mol ratio relative to neodymium within the range of 0.00001 to 0.1 mol, chrominum having a mol ratio relative to gallium within the range of 0.00001 to 0.1 mol and mixtures thereof, wherein said elements are added to a compound having the formula $SrNdGaO_4$, said compound having a $K_2NiF_4$ type crystal structure, and
   a superconductive thin film formed on said substrate, said thin film being composed of an oxide.

2. A method of producing a superconductive device, wherein said method comprises;
   a step of preparing a substrate of a single crystal, said single crystal comprising at least one element selected from the group consisting of calcium having a mol ratio relative to strontium within the range of 0.00001 to 0.1 mol, lanthanum having a mol ratio relative to neodymium within the range of 0.00001 to 0.1 mol, chrominum having mol ratio relative to a gallium within the range of 0.00001 to 0.1 mol and mixtures thereof, wherein said elements are added to a compound having the formula $SrNdGaO_4$, said compound having a $K_2NiF_4$ type crystal structure, and
   a step of forming a superconductive thin film composed of an oxide of which lattice constants a and b each remain within the range of 3.76 to 3.92 angstroms or wherein lattice constants a and b each remain within the range of 5.32 to 5.54 angstroms, said thin film growing epitaxially.

3. A method of producing a superconductive device as claimed in claim 2, wherein said step of forming a superconductive thin film is a step of forming a superconductive thin film of which composition ratio is represented by the following formula:

$$LnBa_2Cu_3O_{7-\delta}$$

($\delta = 0 \sim 1$, Ln:Yb, Er, Y, Ho, Gd, Eu, Dy.

4. A method of producing a superconductive device as claimed in claim 2, wherein said step of forming a superconductive thin film is a step of forming a thin film composed of a Bi-Sr-Ca-Cu-O based oxide.

5. A method of producing a superconductive device as claimed in claim 2, wherein said step of forming a superconductive thin film is a step of forming a thin film composed of a Tl-Ba-Ca-Cu-O based oxide.

6. A superconductive device, wherein said device comprises:
   a substrate of a single crystal composed of a strontium-neodymium-gallium based oxide of which composition includes a $K_2NiF_4$ type crystal structure as represented by the following formula, $$Sr_{1-x}Nd_{1-y}Ga_{1-x}O_{4-w}$$

($-0.1 < x < 0.1$, $-0.1 < y < 0.1$, $-0.1 < z < 0.1$, $-0.2 < w < 0.2$),
   said single crystal comprising at least one element selected from the group consisting of calcium having a mol ratio relative to strontium within the range of 0.00001 to 0.1 mol, lanthanum having a mol ratio relative to neodymium within the range of 0.00001 to 0.1 mol, chromium having a mol ratio relative to gallium within the range of 0.00001 to 0.1 mol, and mixtures thereof, wherein said elements are added to said strontium-neodymium-gallium based oxide, and a superconductive thin film formed on said substrate, said thin film being composed of an oxide.

7. A method of producing a superconductive device, wherein said method comprises;

a step of preparing a substrate of a single crystal composed of a strontium-neodymium-gallium based oxide of which composition includes a $K_2NiF_4$ type crystal structure as represented by the following formula, $$Sr_{1-x}Nd_{1-y}Ga_{1-z}O_{4-w}$$

$(-0.1<x<0.1, -0.1<y<0.1, -0.1<z<0.1, -0.2<w<0.2)$, said single crystal comprising at least one element selected from the group consisting of calcium having a mol ratio relative to strontium within the range of 0.00001 to 0.1 mol, lanthanum having a mol ratio relative to neodymium within the range of 0.00001 to 0.1 mol, chromium having a mol ratio relative to gallium within the range of 0.00001 to 0.1 mol, and mixtures thereof, wherein said elements are added to said strontium-neodymium-gallium based oxide, and a step of forming on said single crystal substrate a superconductive thin film composed of an oxide of which lattice constants a and b each remain within the range of 3.76 to 3.92 angstroms or wherein said lattice constants a and b each remain within the range of 5.32 to 5.54 angstroms, said thin film growing in an epitaxial manner.

8. A method of producing a superconductive device as claimed in claim 3, wherein said step of forming a superconductive thin film is a step of forming a superconductive thin film composed of an oxide of which composition ratio is represented by the following formula:

$$LnBa_2Cu_3O_{7-\delta}$$

$(\delta=0\sim 1$, Ln:Yb, Er, Y, Ho, Gd, Eu, Dy).

9. A method of producing a superconductive device as claimed in claim 3, wherein said step of forming a superconductive thin film is a step of forming a thin film composed of a Bi-Sr-Ca-Cu-O based oxide.

10. A method of producing a superconductive device as claimed in claim 3, wherein said step of forming a superconductive thin film is a step of forming a thin film composed of a Tl-Ba-Ca-Cu-O based oxide.

* * * * *